United States Patent
Gejo et al.

(10) Patent No.: US 11,462,633 B2
(45) Date of Patent: Oct. 4, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Ryohei Gejo, Kawasaki Kanagawa (JP); Tatsunori Sakano, Shinagawa Tokyo (JP); Tomoaki Inokuchi, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/015,782

(22) Filed: Sep. 9, 2020

(65) Prior Publication Data
US 2021/0242336 A1 Aug. 5, 2021

(30) Foreign Application Priority Data
Feb. 5, 2020 (JP) .............................. JP2020-017859

(51) Int. Cl.
*H01L 29/66* (2006.01)
*H01L 29/06* (2006.01)
(Continued)

(52) U.S. Cl.
CPC ...... *H01L 29/7393* (2013.01); *H01L 29/0696* (2013.01); *H01L 29/1095* (2013.01); *H01L 29/66325* (2013.01)

(58) Field of Classification Search
CPC ............. H01L 29/7397; H01L 29/0696; H01L 29/0804–0834; H01L 29/1004;
(Continued)

(56) References Cited

U.S. PATENT DOCUMENTS 5,464,994 A * 11/1995 Shinohe ............ H01L 29/42308
257/147
8,018,008 B2 9/2011 Ozoe
(Continued)

FOREIGN PATENT DOCUMENTS

JP 2009-295961 A 12/2009
JP 4980743 B2 7/2012

OTHER PUBLICATIONS

Harada et al., "Optimal double sided gate control of IGBT for lower turn-off loss and surge voltage suppression," CIPS 2016—9th International Conference on Integrated Power Electronics Systems, pp. 1-5 (2016).

*Primary Examiner* — Natalia A Gondarenko
(74) *Attorney, Agent, or Firm* — Finnegan, Henderson, Farabow, Garrett & Dunner L.L.P.

(57) ABSTRACT

A semiconductor device includes first and second electrode, a semiconductor part therebetween, and first and second control electrode. The first control electrode is provided in a first trench between the first electrode and the semiconductor part. The second control electrode is provided in a second trench between the second electrode and the semiconductor part. The semiconductor part includes first, third, fifth and sixth layers of a first conductivity type and second and fourth layers of a second conductivity type. The second layer is provided the first layer and the first electrode. The third layer is provided between the second layer and the first electrode. The fourth layer is provided between the first layer and the second electrode. The sixth layer is provided between the first layer and the second electrode. The second electrode is electrically connected to the first layer via a first-conductivity-region including the sixth layer.

9 Claims, 10 Drawing Sheets

(51) Int. Cl.
*H01L 29/739* (2006.01)
*H01L 29/10* (2006.01)

(58) Field of Classification Search
CPC ........... H01L 29/1095; H01L 29/66318; H01L 29/66325; H01L 21/74–746; H01L 21/76205; H01L 21/76847; H01L 21/76877; H01L 21/8222; H01L 21/82285; H01L 21/8249; H01L 29/66234–66348; H01L 29/6348; H01L 29/7394; H01L 29/73–7378; H01L 29/739–7398; H01L 29/0623; H01L 29/407; H01L 29/41708; H01L 29/41716; H01L 29/42304; H01L 29/42368; H01L 29/66265; H01L 29/66295–66303; H01L 2924/1305–13056
USPC .......................................... 257/139, 330, 331
See application file for complete search history.

(56) References Cited

U.S. PATENT DOCUMENTS

| | | | | |
|---|---|---|---|---|
| 2015/0091055 | A1* | 4/2015 | Gejo | H01L 29/0619 257/142 |
| 2015/0214299 | A1* | 7/2015 | Blanchard | H01L 29/732 257/488 |
| 2016/0322483 | A1* | 11/2016 | Zhang | H01L 29/4236 |
| 2018/0083129 | A1* | 3/2018 | Kitagawa | H01L 29/7397 |
| 2020/0098903 | A1* | 3/2020 | Satoh | H01L 29/0619 |
| 2021/0057555 | A1* | 2/2021 | Satoh | H01L 29/0804 |

* cited by examiner

FIG. 10B

SEMICONDUCTOR DEVICE

CROSS-REFERENCE TO RELATED APPLICATIONS

This application is based upon and claims the benefit of priority from Japanese Patent Application No. 2020-017859, filed on Feb. 5, 2020; the entire contents of which are incorporated herein by reference.

FIELD

Embodiments relate to a semiconductor device.

BACKGROUND

It is desirable to reduce the switching loss of a power control semiconductor device.

DETAILED DESCRIPTION

According to one embodiment, a semiconductor device includes a first electrode; a second electrode facing the first electrode; a semiconductor part provided between the first electrode and the second electrode; a first control electrode disposed between the first electrode and the semiconductor part inside a first trench provided in the semiconductor part, the first control electrode being electrically insulated from the semiconductor part by a first insulating film and electrically insulated from the first electrode by a second insulating film; and a second control electrode disposed between the second electrode and the semiconductor part inside a second trench provided in the semiconductor part, the second control electrode being electrically insulated from the semiconductor part by a third insulating film and electrically insulated from the second electrode by a fourth insulating film. The semiconductor part includes a first semiconductor layer of a first conductivity type, a second semiconductor layer of a second conductivity type, a third semiconductor layer of the first conductivity type, a fourth semiconductor layer of the second conductivity type, a fifth semiconductor layer of the first conductivity type, and a sixth semiconductor layer of the first conductivity type. The first semiconductor layer extending between the first electrode and the second electrode. The first and second trenches extend in the first semiconductor layer. The second semiconductor layer is provided between the first semiconductor layer and the first electrode, the second semiconductor layer facing the first control electrode via the first insulating film and being electrically connected to the first electrode. The third semiconductor layer is selectively provided between the second semiconductor layer and the first electrode, the third semiconductor layer contacting the first insulating film and being electrically connected to the first electrode. The fourth semiconductor layer is provided between the first semiconductor layer and the second electrode, the fourth semiconductor layer facing the second control electrode via the third insulating film and being electrically connected to the second electrode. The fifth semiconductor layer is selectively provided between the fourth semiconductor layer and the second electrode, the fifth semiconductor layer contacting the third insulating film and being electrically connected to the second electrode. The sixth semiconductor layer is selectively provided between the first semiconductor layer and the second electrode, the second electrode being connected to the first semiconductor layer via a first-conductivity-type region including the sixth semiconductor layer.

Embodiments will now be described with reference to the drawings. The same portions inside the drawings are marked with the same numerals; a detailed description is omitted as appropriate; and the different portions are described. The drawings are schematic and conceptual; and the relationships between the thicknesses and widths of portions, the proportions of sizes among portions, etc., are not necessarily the same as the actual values. The dimensions and/or the proportions may be illustrated differently between the drawings, even in the case where the same portion is illustrated.

The arrangements and the configurations of the portions are described using an X-axis, a Y-axis, and a Z-axis shown in each drawing. The X-axis, the Y-axis, and the Z-axis are orthogonal to each other and respectively refer to an X-direction, a Y-direction, and a Z-direction. There are cases where the Z-direction is described as upward, and the reverse direction is described as downward.

First Embodiment

Figure 1:
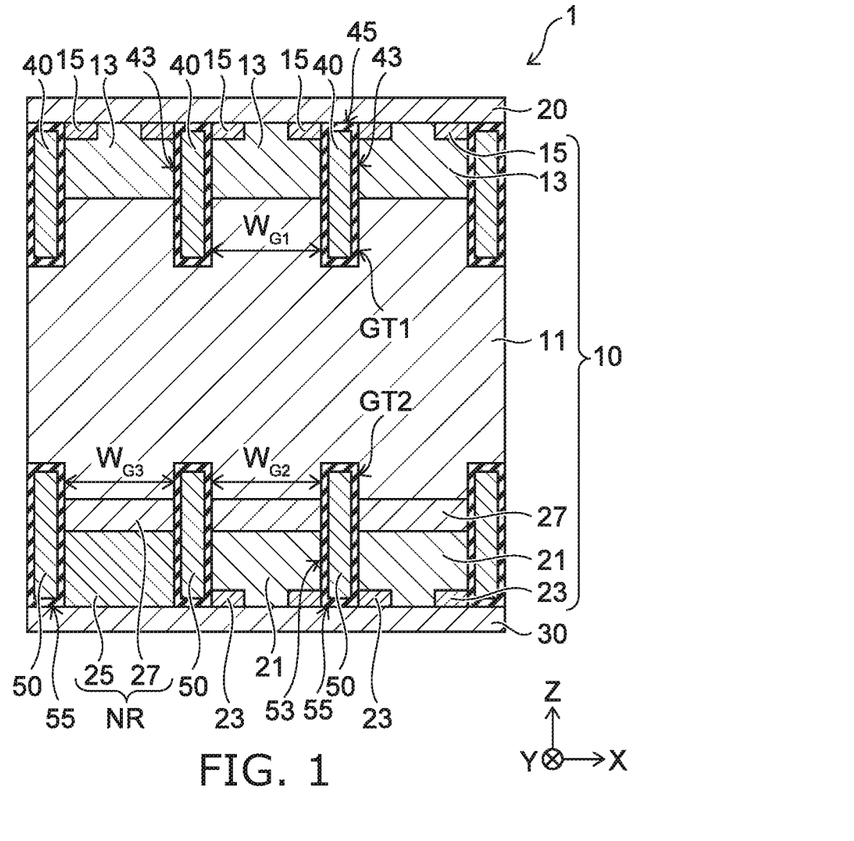
FIG. 1 is a schematic cross section showing a semiconductor device according to a first embodiment.

FIG. 1 is a schematic cross section showing a semiconductor device 1 according to a first embodiment. The semiconductor device 1 is a so-called reverse-conducting IGBT (Insulated Gate Bipolar Transistor).

The semiconductor device 1 includes a semiconductor part 10, a first electrode 20, a second electrode 30, a first control electrode 40, and a second control electrode 50.

The first electrode 20 and the second electrode 30 face each other, and the semiconductor part 10 is provided between the first electrode 20 and the second electrode 30. The first electrode 20 is, for example, an emitter electrode, and the second electrode 30 is, for example, a collector electrode.

The semiconductor part 10 is, for example, silicon. The first electrode 20 and the second electrode 30 are, for example, metal layers including aluminum (Al).

The first control electrode 40 is provided between the semiconductor part 10 and the first electrode 20. The first control electrode 40 is disposed inside a first trench GT1 provided in the semiconductor part 10. The first control electrode 40 is electrically insulated from the semiconductor part 10 by a first insulating film 43. Also, the first control electrode 40 is electrically insulated from the first electrode 20 by a second insulating film 45.

The second control electrode 50 is provided between the semiconductor part 10 and the second electrode 30. The second control electrode 50 is disposed inside a second trench GT2 provided in the semiconductor part 10. The second control electrode 50 is electrically insulated from the semiconductor part 10 by a third insulating film 53. Also, the second control electrode 50 is electrically insulated from the second electrode 30 by a fourth insulating film 55.

The first control electrode 40 is, for example, a gate electrode at the emitter side. The second control electrode 50 is a gate electrode at the collector side. The first control electrode 40 and the second control electrode are, for example, conductive polysilicon.

The semiconductor part 10 includes a first semiconductor layer 11 of a first conductivity type, a second semiconductor layer 13 of a second conductivity type, a third semiconductor layer 15 of the first conductivity type, a fourth semiconductor layer 21 of the second conductivity type, a fifth semiconductor layer 23 of the first conductivity type, a sixth semiconductor layer 25 of the first conductivity type, and a seventh semiconductor layer 27 of the first conductivity type. Hereinbelow, the first conductivity type is described as an n-type, and the second conductivity type is described as a p-type.

The first semiconductor layer 11 extends between the first electrode 20 and the second electrode 30, and the first trench GT1 and the second trench GT2 extend in the first semiconductor layer 11. The first semiconductor layer 11 is, for example, an n-type base layer.

The second semiconductor layer 13 is provided between the first semiconductor layer 11 and the first electrode 20 and faces the first control electrode 40 via the first insulating film 43. The second semiconductor layer 13 is electrically connected to the first electrode 20. The second semiconductor layer 13 is, for example, a p-type base layer.

The third semiconductor layer 15 is selectively provided between the second semiconductor layer 13 and the first electrode 20. The third semiconductor layer 15 contacts the first insulating film 43 and is electrically connected to the first electrode 20. The third semiconductor layer 15 is, for example, an n-type emitter layer.

The fourth semiconductor layer 21 is provided between the first semiconductor layer 11 and the second electrode 30 and faces the second control electrode 50 via the third insulating film 53. The fourth semiconductor layer 21 is electrically connected to the second electrode. The fourth semiconductor layer 21 is, for example, a p-type collector layer.

The fifth semiconductor layer 23 is selectively provided between the fourth semiconductor layer 21 and the second electrode 30. The fifth semiconductor layer 23 contacts the third insulating film 53 and is electrically connected to the second electrode 30. The fifth semiconductor layer 23 is, for example, an n-type collector layer.

The sixth semiconductor layer 25 is selectively provided between the first semiconductor layer 11 and the second electrode 30. The second electrode 30 is connected to the first semiconductor layer 11 via a first-conductivity-type region NR including the sixth semiconductor layer 25. The sixth semiconductor layer 25 is, for example, an n-type cathode layer.

The seventh semiconductor layer 27 is provided between the first semiconductor layer 11 and the fourth semiconductor layer 21. The seventh semiconductor layer 27 includes a first-conductivity-type impurity with a higher concentration than the first-conductivity-type impurity of the first semiconductor layer 11. The seventh semiconductor layer is, for example, an n-type buffer layer. The fifth semiconductor layer 23 includes a first-conductivity-type impurity with a higher concentration than the first-conductivity-type impurity of the seventh semiconductor layer 27.

The seventh semiconductor layer 27 is provided also between the first semiconductor layer 11 and the sixth semiconductor layer 25. The sixth semiconductor layer 25 includes a first-conductivity-type impurity with a higher concentration than the first-conductivity-type impurity of the seventh semiconductor layer 27 and is electrically connected to the second electrode 30. In the example, the first-conductivity-type region NR includes the sixth semiconductor layer 25 and the seventh semiconductor layer 27.

As shown in FIG. 1, multiple first control electrodes 40 are provided between the semiconductor part 10 and the first electrode 20. Also, multiple second control electrodes 50 are provided between the semiconductor part 10 and the second electrode 30.

The sixth semiconductor layer 25 is provided between two adjacent second control electrodes 50 of the multiple second control electrodes 50. The sixth semiconductor layer 25 faces the two adjacent second control electrodes 50 via the third insulating film 53.

For example, a distance $W_{G1}$ between the adjacent first control electrodes 40 may be the same as or different from a distance $W_{G2}$ between the adjacent second control electrodes 50. A distance $W_{G3}$ between the second control electrodes 50 where the sixth semiconductor layer 25 is provided may be different from the distance $W_{G2}$ between the other adjacent second control electrodes 50.

Figure 2:
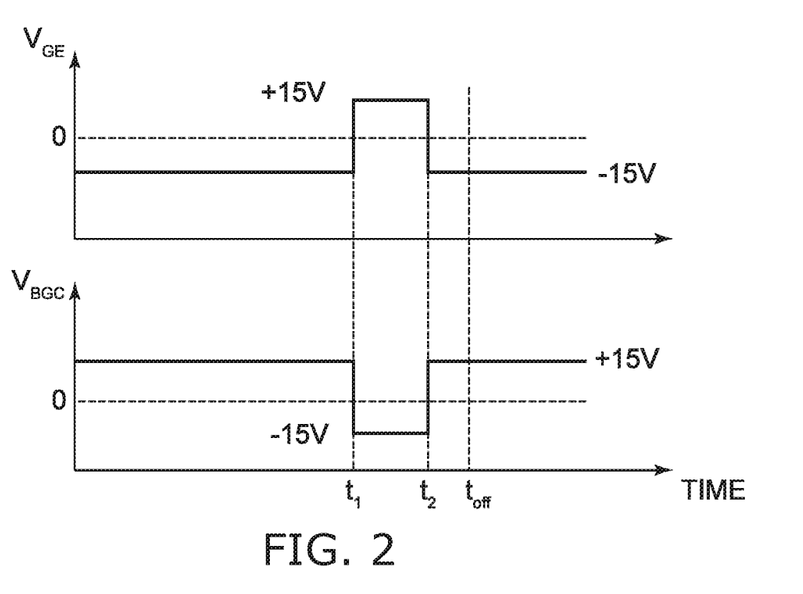
FIG. 2 is a time chart showing a method for controlling the semiconductor device according to the first embodiment.

FIG. 2 is a time chart showing a method for controlling the semiconductor device 1 according to the first embodiment. For example, a power converter (not illustrated) such as an inverter or the like is configured using multiple semiconductor devices 1. FIG. 2 shows the method for controlling a control voltages $V_{GE}$ and $V_{BGC}$ when the semiconductor device 1 is operated in the diode mode in such a power converter.

When operating in the diode mode, the potential of the first electrode 20 is controlled to be greater than the potential of the second electrode 30. The potentials of the first and second electrodes 20 and 30 are reversed at a time $t_{OFF}$ at which the semiconductor device 1 is caused to transition from the diode mode to the IGBT mode.

The control voltage $V_{GE}$ is applied between the first electrode 20 and the first control electrode 40. For example, the control voltage $V_{GE}$ is a positive voltage when the potential of the first control electrode 40 is greater than the potential of the first electrode 20.

The control voltage $V_{BGC}$ is applied between the second electrode 30 and the second control electrode 50. For example, the control voltage $V_{BGC}$ is a positive voltage when the potential of the second control electrode 50 is greater than the potential of the second electrode 30.

As shown in FIG. 2, the control voltage $V_{GE}$ is maintained at negative 15 V from a start timing (not illustrated) of the diode mode until a time $t_1$. The control voltage $V_{GE}$ is increased to positive 15 V at the time $t_1$, is maintained at positive 15 V until a time $t_2$, and subsequently is reduced to negative 15 V at the time $t_2$. The period between the time $t_2$ and the time $t_{OFF}$ is a so-called dead time set to avoid a short-circuit of the power conversion circuit.

On the other hand, the control voltage $V_{BGC}$ is maintained at positive 15 V from the start timing (not illustrated) of the diode mode until the time $t_1$. The control voltage $V_{BGC}$ is reduced to negative 15 V at the time $t_1$, is maintained at negative 15 V until the time $t_2$, and subsequently is increased to positive 15 V at the time $t_2$.

Figure 3A:
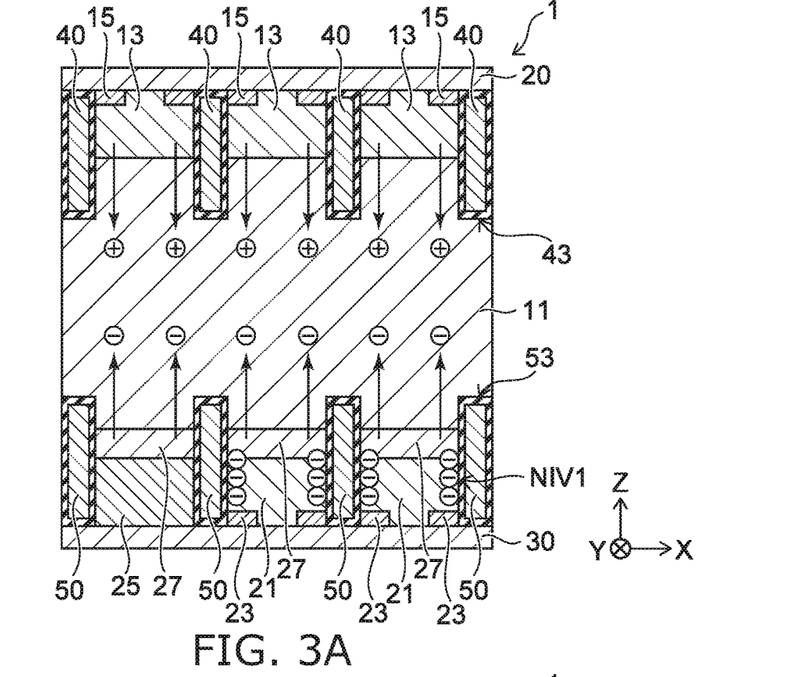
FIGS. 3A and 3B are schematic cross-sectional views showing the method for controlling the semiconductor device according to the first embodiment.
Figure 3B:
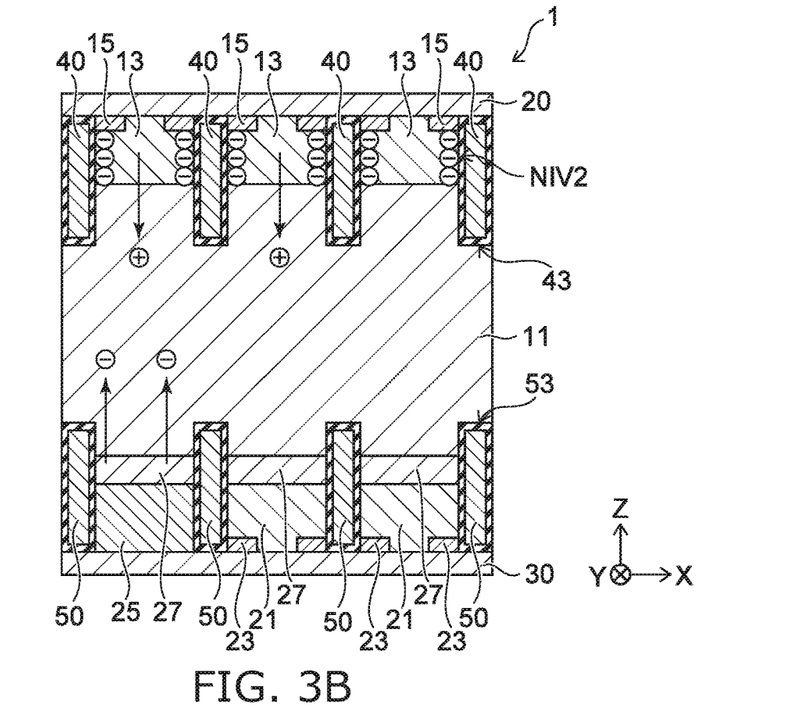

FIGS. 3A and 3B are schematic cross-sectional views showing the method for controlling the semiconductor device 1 according to the first embodiment. FIGS. 3A and 3B show the flow of the charge in the semiconductor device 1 corresponding to the control process of the control voltages $V_{GE}$ and $V_{BGC}$ shown in FIG. 2.

FIG. 3A shows the flow of the charge in the period from the start of the diode mode to the time $t_1$. The p-n junction between the first semiconductor layer 11 and the second semiconductor layer 13 is forward-biased, and holes are injected from the second semiconductor layer 13 into the first semiconductor layer 11. On the other hand, the p-n junction between the fourth semiconductor layer 21 and the seventh semiconductor layer 27 is reverse biased; therefore, electrons are injected from the electrode 30 into the first semiconductor layer 11 via the first-conductivity-type region NR, i.e., the sixth semiconductor layer 25 and the seventh semiconductor layer 27.

A first-conductivity-type inversion layer NIV1 is induced at the interface between the fourth semiconductor layer 21 and the third insulating film 53 by the control voltage $V_{BGC}$, e.g., positive 15 V applied to the second control electrode 50. Therefore, electrons are injected from the electrode 30 into the first semiconductor layer 11 via the fifth semiconductor layer 23, the first-conductivity-type inversion layer NIV1, and the seventh semiconductor layer 27. Thereby, in the period from the start timing of the diode mode to the time $t_1$, the densities of the electrons and holes in the first semiconductor layer 11 can be increased, and the on-resistance can be reduced.

FIG. 3B shows the flow of the charge in the period from the time $t_1$ to the time $t_2$. In the period from the time $t_1$ to the time $t_2$, the control voltage $V_{BGC}$, e.g., negative 15 V is applied to the second control electrode 50; and the first-conductivity-type inversion layer NIV1 in the fourth semiconductor layer 21 disappears. Therefore, the electron injection into the first semiconductor layer 11 via the inversion layer NIV is stopped, and the electron injection from the second electrode 30 into the first semiconductor layer 11 occurs only along the path via the sixth semiconductor layer 25 and the seventh semiconductor layer 27. As a result, the electron injection from the second electrode 30 into the first semiconductor layer 11 is reduced, and the hole injection from the second semiconductor layer 13 into the first semiconductor layer 11 is reduced.

Also, the control voltage $V_{GE}$, e.g., positive 15 V is applied to the first control electrode 40, and a first-conductivity-type inversion layer NIV2 is induced at the interface between the second semiconductor layer 13 and the first insulating film 43. The electrons in the first semiconductor layer 11 are ejected to the first electrode 20 via the first-conductivity-type inversion layer NIV2 and the third semiconductor layer 15.

The fourth semiconductor layer 21 includes, for example, a second-conductivity-type impurity with substantially the same concentration as the second-conductivity-type impurity of the second semiconductor layer 13. The threshold voltage of the first control electrode 40 is substantially equal to the threshold voltage of the second control electrode 50, and the first-conductivity-type inversion layers NIV2 and NIV1 are induced respectively by the control voltages $V_{GE}$ and $V_{BGC}$ of positive 15 V.

By performing such a control of the first and second control electrodes 40 and 50 in the semiconductor device 1, the densities of the electrons and holes in the first semiconductor layer 11 in the period $t_1$ to $t_2$ directly before the transition from the diode mode to the IGBT mode can be reduced. Thereby, the ejection time of the electrons and holes in the first semiconductor layer 11 in the recovery period from the diode mode, i.e., the time necessary to deplete the first semiconductor layer 11, can be reduced, and the recovery loss can be reduced.

Figure 4:
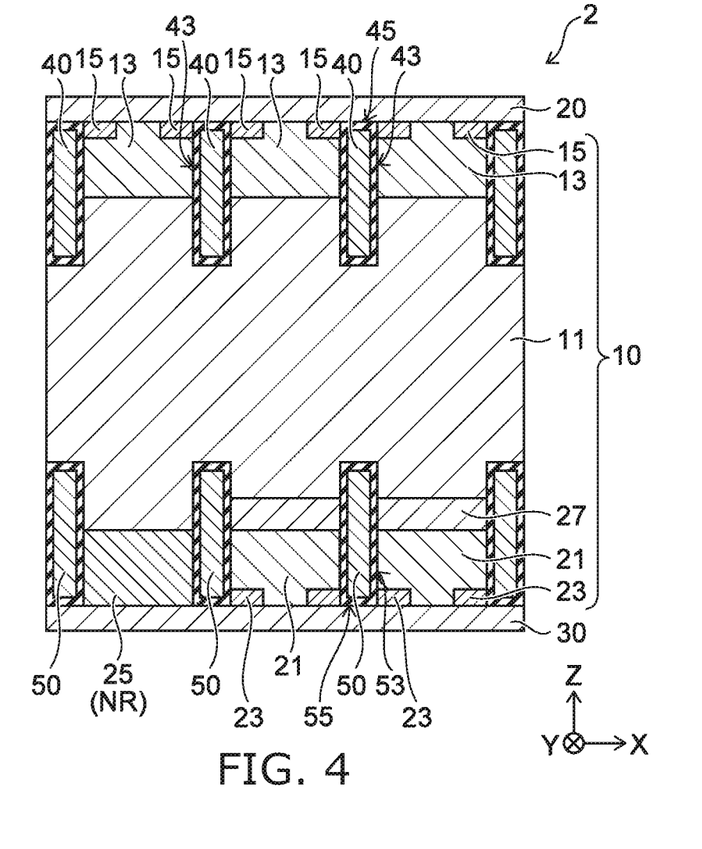
FIG. 4 is a schematic cross section showing a semiconductor device according to a modification of the first embodiment.

FIG. 4 is a schematic cross section showing a semiconductor device 2 according to a modification of the first embodiment.

In the semiconductor device 2, the seventh semiconductor layer 27 is not provided between the first semiconductor layer 11 and the sixth semiconductor layer 25.

The seventh semiconductor layer 27 is provided to prevent the depletion region induced in the first semiconductor layer 11 from reaching the fourth semiconductor layer 21 of the second conductivity type. Therefore, the seventh semiconductor layer 27 may not be disposed in the first-conductivity-type region NR in which the sixth semiconductor layer 25 of the first conductivity type is provided.

In the semiconductor device 2 as well, the recovery loss in the diode operation can be reduced by the control voltages $V_{GE}$ and $V_{BGC}$ shown in FIG. 2.

Figure 5A:
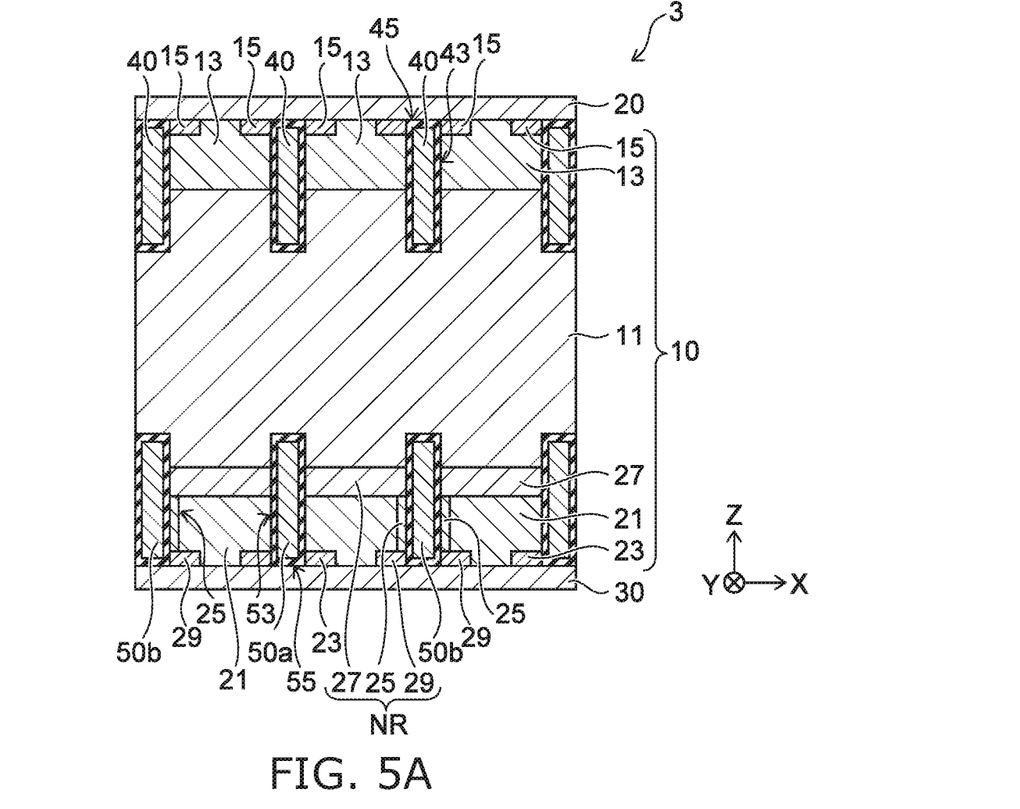
FIGS. 5A and 5B are schematic views showing a semiconductor device according to another modification of the first embodiment.
Figure 5B:
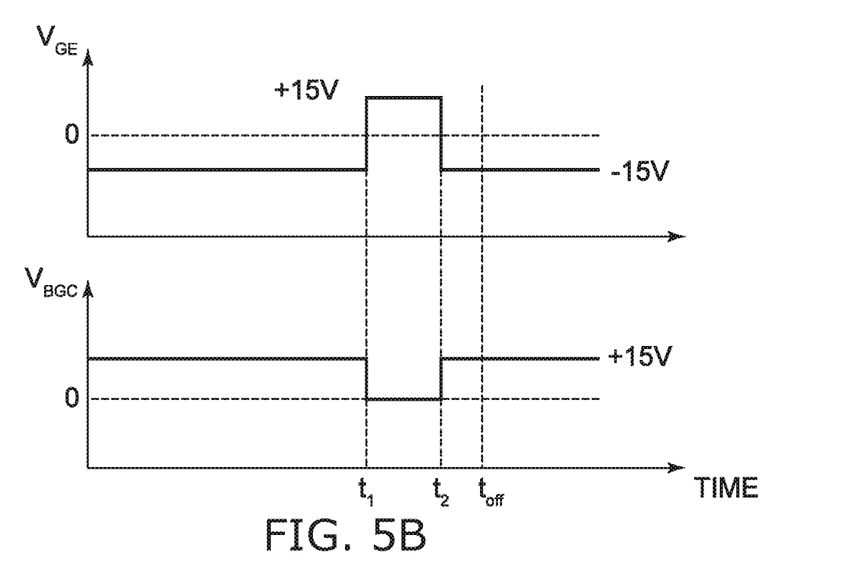

FIGS. 5A and 5B are schematic views showing a semiconductor device 3 according to another modification of the first embodiment. FIG. 5A is a cross-sectional view of the semiconductor device 3. FIG. 5B is a time chart showing a method for controlling the semiconductor device 3.

In the semiconductor part 10 of the semiconductor device 3 as shown in FIG. 5A, the fourth semiconductor layer 21 faces a second control electrode 50a via the third insulating film 53. The sixth semiconductor layer 25 faces a second control electrode 50b via another third insulating film 53.

The fourth semiconductor layer 21 and the sixth semiconductor layer 25 are provided between the adjacent second control electrodes 50a and 50b. The sixth semiconductor layer 25 is positioned between the fourth semiconductor layer 21 and the second control electrode 50b.

The semiconductor part 10 further includes an eighth semiconductor layer 29 of the first conductivity type provided between the sixth semiconductor layer 25 and the second electrode 30. The eighth semiconductor layer 29 contacts another third insulating film 53 and is electrically connected to the second electrode 30. The eighth semiconductor layer 29 includes a first-conductivity-type impurity with a higher concentration than the first-conductivity-type impurity of the sixth semiconductor layer 25. The first-conductivity-type region NR includes the sixth semiconductor layer 25, the seventh semiconductor layer 27, and the eighth semiconductor layer 29.

As shown in FIG. 5B, the control voltage $V_{GE}$ is maintained at negative 15 V from the start timing (not illustrated) of the diode mode until the time $t_1$. The control voltage $V_{GE}$ is increased to positive 15 V at the time $t_1$, is maintained at positive 15 V until the time $t_2$, and subsequently is reduced to negative 15 V at the time $t_2$.

On the other hand, the control voltage $V_{BGC}$ is maintained at positive 15 V from the start timing (not illustrated) of the diode mode until the time $t_1$. For example, the control voltage $V_{BGC}$ is reduced to 0 V at the time $t_1$, is maintained at 0 V until the time $t_2$, and subsequently is increased to positive 15 V at the time $t_2$.

Figure 6A:
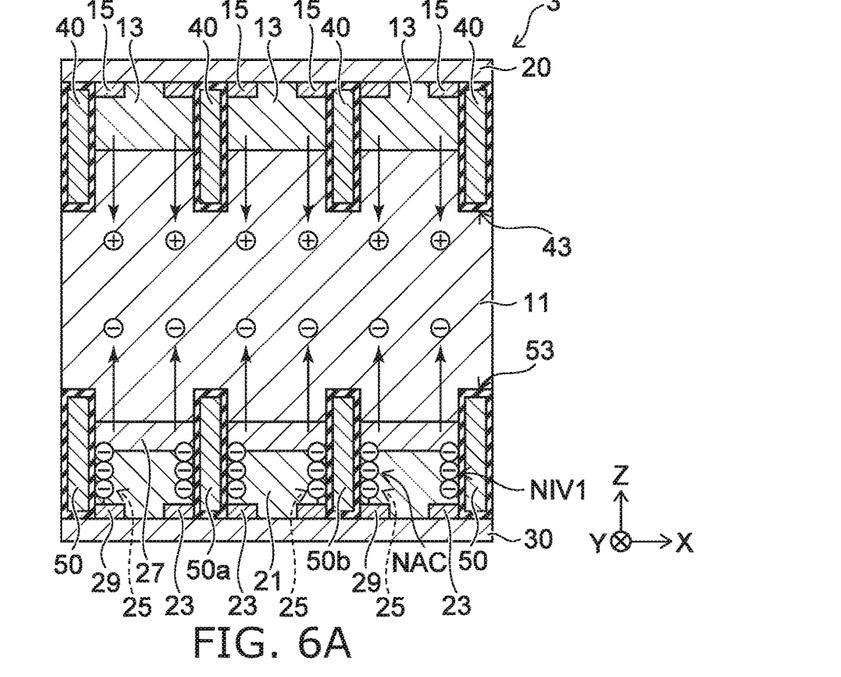
FIGS. 6A and 6B are schematic views showing the method for controlling the semiconductor device according to the other modification of the first embodiment.
Figure 6B:
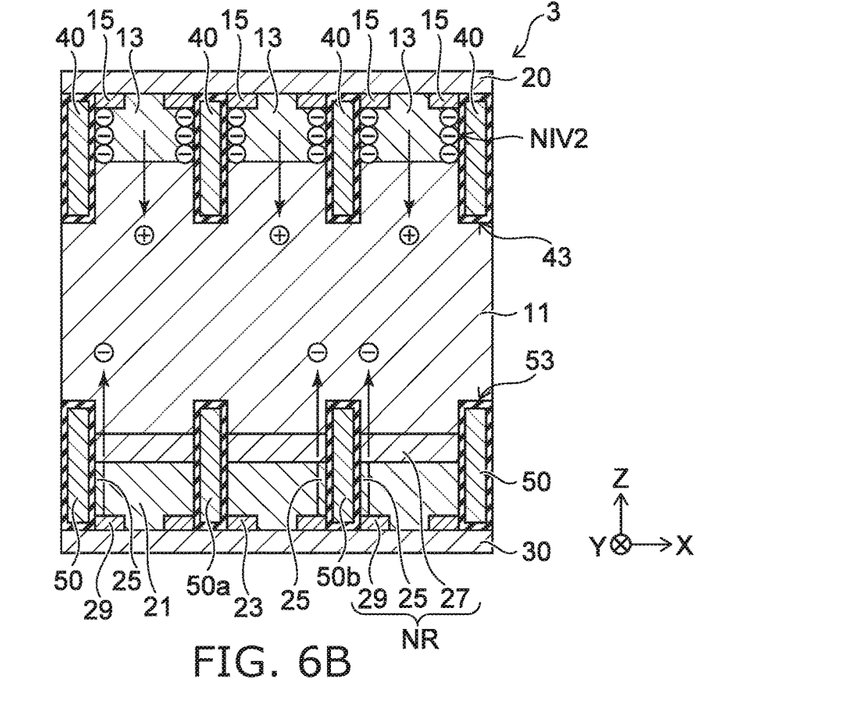

FIGS. 6A and 6B are schematic views showing the method for controlling the semiconductor device 3 according to the other modification of the first embodiment. FIGS. 6A and 6B show the flow of the charge in the semiconductor device 3 corresponding to the control processes due to the control voltages $V_{GE}$ and $V_{BGC}$ shown in FIG. 5B.

FIG. 6A shows the flow of the charge in the period from the start of the diode mode to the time $t_1$. The p-n junction between the first semiconductor layer 11 and the second semiconductor layer 13 is forward-biased, and holes are injected from the second semiconductor layer 13 into the first semiconductor layer 11. The first-conductivity-type inversion layer NIV1 is induced at the interface between the fourth semiconductor layer 21 and the third insulating film 53 by the control voltage $V_{BGC}$, e.g., positive 15 V applied to the second control electrode 50. A first-conductivity-type charge accumulation layer NAC is induced at the interface between the sixth semiconductor layer 25 and the third insulating film 53. Therefore, electrons are injected into the first semiconductor layer 11 from the electrode 30 through a path via the fifth semiconductor layer 23, the first-conductivity-type inversion layer NIV1, and the seventh semiconductor layer 27 and a path via the eighth semiconductor layer 29, the first-conductivity-type charge accumulation layer NAC, and the seventh semiconductor layer 27. As a result, in the period from the start of the diode mode to the time $t_1$, the densities of the electrons and holes in the first semiconductor layer 11 can be increased, and the on-resistance can be reduced.

FIG. 6B shows the flow of the charge in the period from the time $t_1$ to the time $t_2$. In the period from the time $t_1$ to the time $t_2$, the control voltage $V_{BGC}$ applied between the second control electrode 50 and the electrode 30 is, for example, 0 V. Therefore, the first-conductivity-type inversion layer NIV1 that is induced between the fourth semiconductor layer 21 and the third insulating film 53 disappears. As a result, the electron injection from the second electrode 30 into the first semiconductor layer 11 occurs only through the path via the eighth semiconductor layer 29, the sixth semiconductor layer 25, and the seventh semiconductor layer 27; and the electron injection from the second electrode 30 into the first semiconductor layer 11 is reduced. Accordingly, the hole injection from the second semiconductor layer 13 into the first semiconductor layer 11 also is reduced.

On the other hand, the control voltage $V_{GE}$, e.g., positive 15 V is applied to the first control electrode 40; and the first-conductivity-type inversion layer NIV2 is induced at the interface between the second semiconductor layer 13 and the first insulating film 43. The electrons in the first semiconductor layer 11 are ejected to the first electrode 20 via the first-conductivity-type inversion layer NIV2 and the third semiconductor layer 15.

In the semiconductor device 3, the densities of the electrons and holes in the first semiconductor layer 11 in the period $t_1$ to $t_2$ directly before the transition from the diode mode to the IGBT mode can be reduced by the control voltages $V_{GE}$ and $V_{BGC}$ shown in FIG. 5B. Thereby, the ejection time of the electrons and holes of the first semiconductor layer 11 in the recovery period from the diode mode can be reduced, and the recovery loss can be reduced.

Figure 7:
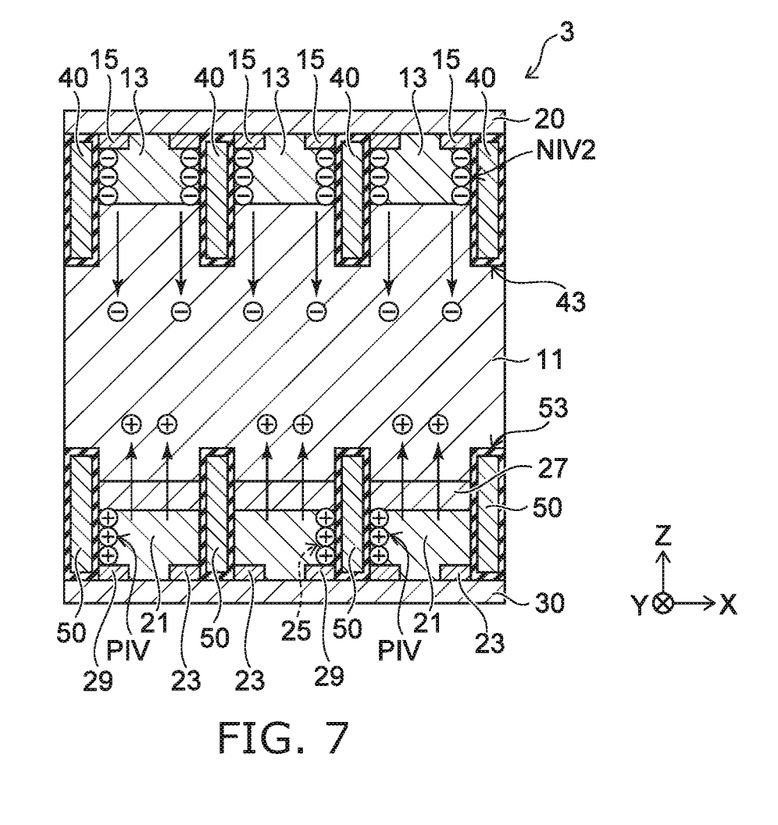
FIG. 7 is a schematic cross-sectional view showing another method for controlling the semiconductor device according to the other modification of the first embodiment.

FIG. 7 is a schematic cross-sectional view showing another method for controlling the semiconductor device 3 according to the other modification of the first embodiment. FIG. 7 shows the flow of the charge when the semiconductor device 3 is operated in the IGBT mode.

In the IGBT mode, the potential of the second electrode 30 is maintained to be greater than the potential of the first electrode 20. Also, the control voltage $V_{BGC}$, e.g., negative 15 V is applied between the second electrode 30 and the second control electrode 50. Therefore, a second-conductivity-type charge accumulation layer PIV is induced between the sixth semiconductor layer 25 and the second control electrode 50.

An on/off-control of the collector current flowing from the second electrode 30 toward the first electrode 20 is performed by applying the control voltage $V_{GE}$, e.g., positive 15 V or negative 15 V between the first electrode 20 and the first control electrode 40.

As shown in FIG. 7, the first-conductivity-type inversion layer NIV2 is induced between the second semiconductor layer 13 and the first control electrode 40. Therefore, electrons are injected from the first electrode 20 into the first semiconductor layer 11 via the third semiconductor layer 15 and the first-conductivity-type inversion layer NIV2.

Accordingly, holes are injected from the fourth semiconductor layer 21 into the first semiconductor layer 11 via the seventh semiconductor layer 27. Also, the ejection of electrons from the first semiconductor layer 11 to the second electrode 30 is suppressed by the second-conductivity-type charge accumulation layer PIV induced between the sixth semiconductor layer 25 and the second control electrode 50. Thereby, the densities of the electrons and holes in the first semiconductor layer 11 are increased, and the on-resistance is reduced. It is favorable for the entire sixth semiconductor layer 25 to be inverted to the second conductivity type to cause this effect to be more pronounced when a negative control voltage $V_{BGC}$ is applied between the second electrode 30 and the second control electrode 50.

Second Embodiment

Figure 8A:
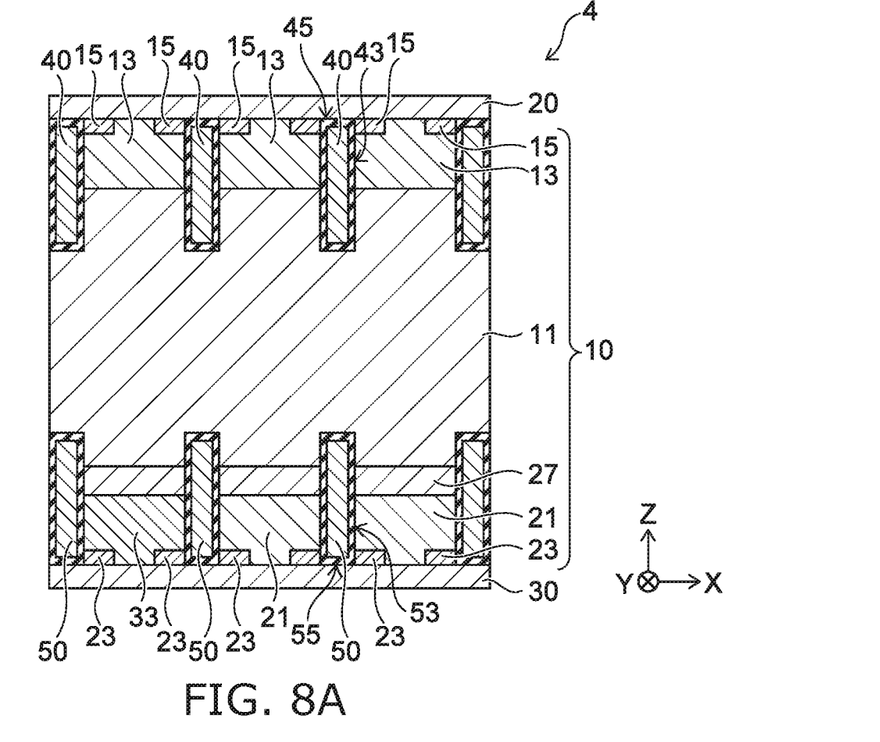
FIGS. 8A and 8B are schematic views showing a semiconductor device according to a second embodiment.
Figure 8B:
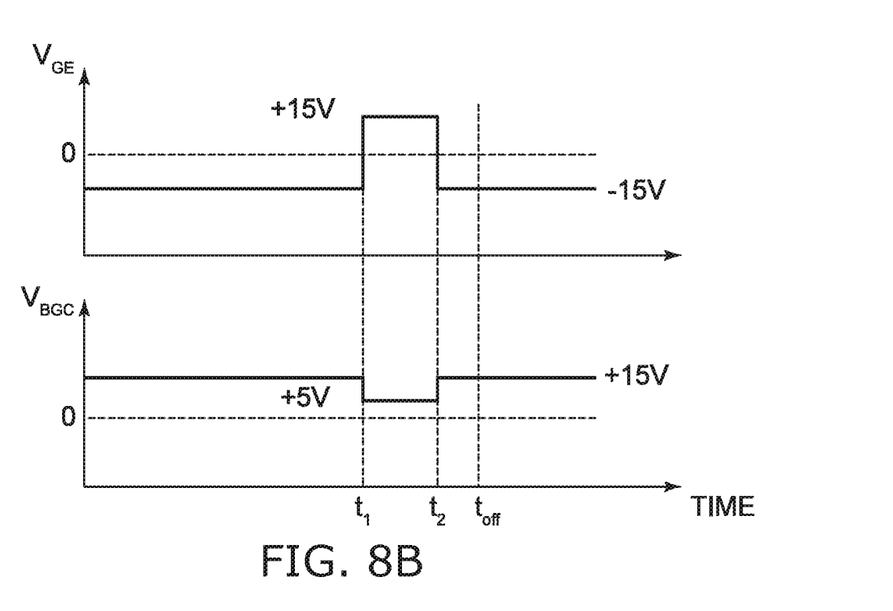

FIGS. 8A and 8B are schematic views showing a semiconductor device 4 according to a second embodiment. FIG. 8A is a cross-sectional view of the semiconductor device 4. FIG. 8B is a time chart showing a method for controlling the semiconductor device 4.

As shown in FIG. 8A, the semiconductor part 10 of the semiconductor device 4 includes a ninth semiconductor layer 33 of the second conductivity type selectively provided between the first semiconductor layer 11 and the second electrode 30. In other words, the semiconductor device 4 includes a portion where the fourth semiconductor layer 21 is provided between the adjacent second control electrodes 50, and another portion where the ninth semiconductor layer 33 is provided between the adjacent second control electrodes 50. The semiconductor part 10 further includes the fifth semiconductor layer 23 provided between the ninth semiconductor layer 33 and the second electrode 30.

The ninth semiconductor layer 33 faces at least one of the mutually-adjacent second control electrodes 50 via the third insulating film 53. In the example, the ninth semiconductor layer 33 faces both of the mutually-adjacent second control electrodes 50 via the third insulating film 53. The ninth semiconductor layer 33 includes a second-conductivity-type impurity with a lower concentration than the second-conductivity-type impurity of the fourth semiconductor layer 21.

As shown in FIG. 8B, the control voltage $V_{GE}$ is maintained at negative 15 V from the start timing (not illustrated) of the diode mode until the time $t_1$. The control voltage $V_{GE}$ is increased to positive 15 V at the time $t_1$, is maintained at positive 15 V until the time $t_2$, and subsequently is reduced to negative 15 V at the time $t_2$.

On the other hand, the control voltage $V_{BGC}$ is maintained at positive 15 V from the start timing (not illustrated) of the diode mode until the time $t_1$. For example, the control voltage $V_{BGC}$ is reduced to positive 5 V at the time $t_1$, is maintained at positive 5 V until the time $t_2$, and subsequently is increased to positive 15 V at the time $t_2$.

Figure 9A:
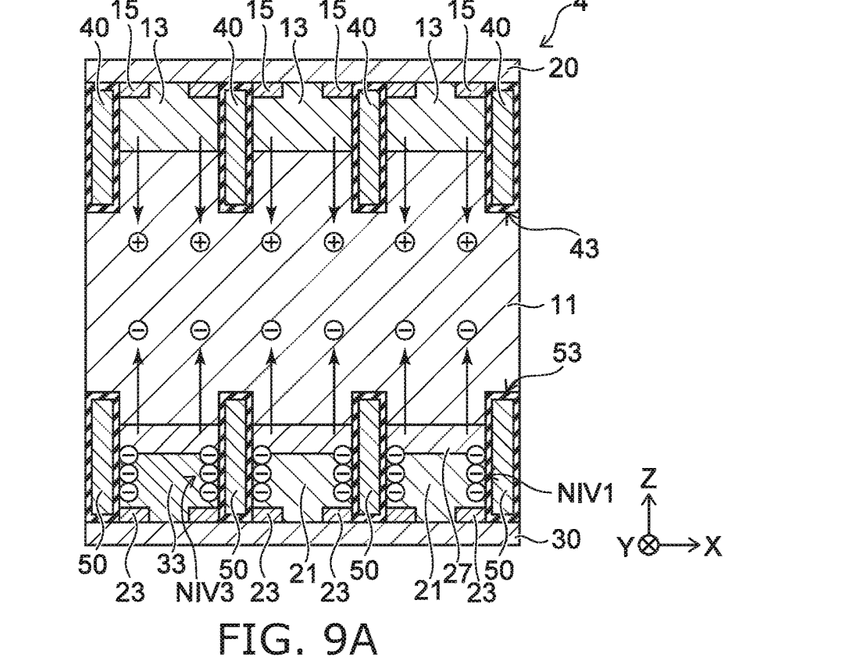
FIGS. 9A and 9B are schematic views showing the method for controlling the semiconductor device according to the other modification of the first embodiment.
Figure 9B:
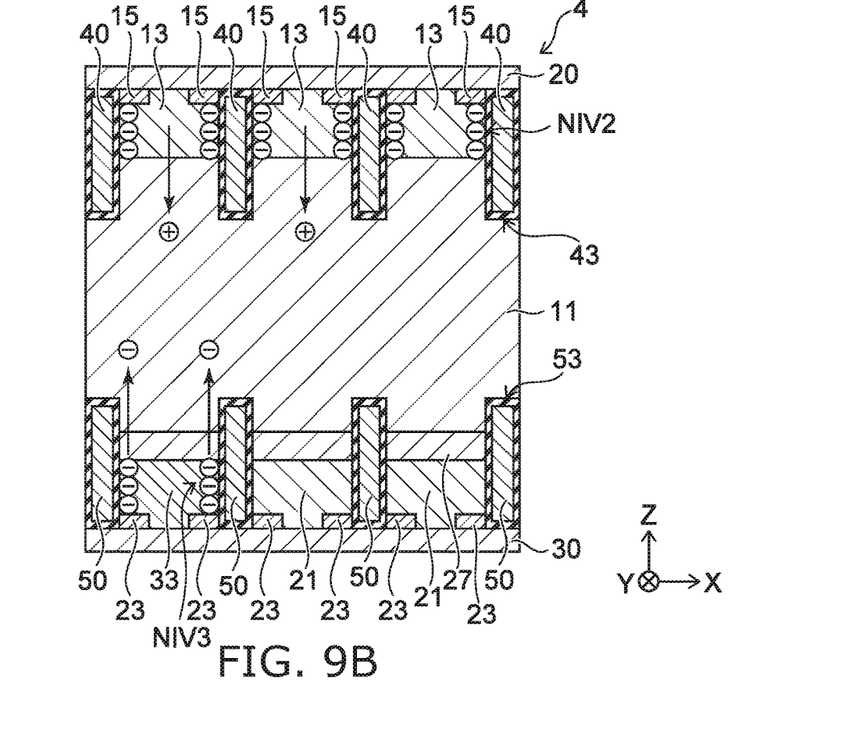

FIGS. 9A and 9B are schematic views showing the method for controlling the semiconductor device 4 according to the other modification of the first embodiment. FIGS. 9A and 9B show the flow of the charge in the semiconductor device 4 corresponding to the control processes due to the control voltages $V_{GE}$ and $V_{BGC}$ shown in FIG. 8B.

FIG. 9A shows the flow of the charge in the period from the start of the diode mode to the time $t_1$. The p-n junction between the first semiconductor layer 11 and the second semiconductor layer 13 is forward-biased, and holes are injected from the second semiconductor layer 13 into the first semiconductor layer 11. The first-conductivity-type inversion layer NIV1 is induced at the interface between the fourth semiconductor layer 21 and the third insulating film 53 by the control voltage $V_{BGC}$ of positive 15 V applied to the second control electrode 50. Also, a first-conductivity-type inversion layer NIV3 is induced at the interface between the ninth semiconductor layer 33 and the third insulating film 53.

Electrons are injected from the electrode 30 into the first semiconductor layer 11 through a path via the fifth semiconductor layer 23, the first-conductivity-type inversion layer NIV1, and the seventh semiconductor layer 27 and a path via the fifth semiconductor layer 23, the first-conductivity-type inversion layer NIV3, and the seventh semiconductor layer 27. As a result, the densities of the electrons and holes in the first semiconductor layer 11 in the period from the start of the diode mode to the time $t_1$ can be increased, and the on-resistance can be reduced.

FIG. 9B shows the flow of the charge in the period from the time $t_1$ to the time $t_2$. The control voltage $V_{BGC}$ that is applied between the second control electrode 50 and the electrode 30 is positive 5 V in the period from the time $t_1$ to the time $t_2$. In the example, the threshold voltage for inducing the first-conductivity-type inversion layer NIV2 at the interface between the fourth semiconductor layer 21 and the third insulating film 53 is greater than positive 5 V. On the other hand, the threshold voltage for inducing the first-conductivity-type inversion layer NIV3 at the interface between the ninth semiconductor layer 33 and the other third insulating film 53 is less than positive 5 V.

Therefore, by lowering the control voltage $V_{BGC}$ between the second electrode 30 and the second control electrode 50 to positive 5 V, the first-conductivity-type inversion layer NIV1 disappears, and the first-conductivity-type inversion layer NIV3 is maintained. As a result, the electron injection from the second electrode 30 into the first semiconductor layer 11 occurs only through the path via the first-conductivity-type inversion layer NIV3, and the electron injection from the second electrode into the first semiconductor layer 11 is reduced. Accordingly, the holes that are injected from the second semiconductor layer 13 into the first semiconductor layer 11 also are reduced.

The control voltage $V_{GE}$ of positive 15 V is applied to the first control electrode 40; and the first-conductivity-type inversion layer NIV2 is induced at the interface between the second semiconductor layer 13 and the first insulating film 43. Therefore, the electrons in the first semiconductor layer 11 are ejected to the first electrode 20 via the first-conductivity-type inversion layer NIV2 and the third semiconductor layer 15.

In the semiconductor device 4, the densities of the electrons and holes in the first semiconductor layer 11 in the period $t_1$ to $t_2$ directly before the transition from the diode mode to the IGBT mode can be reduced by the control of the carriers by the control voltages $V_{GE}$ and $V_{BGC}$ shown in FIG. 8B. Thereby, the ejection time of the electrons and holes of the first semiconductor layer 11 in the recovery period from the diode mode can be reduced, and the recovery loss can be reduced.

Figure 10A:
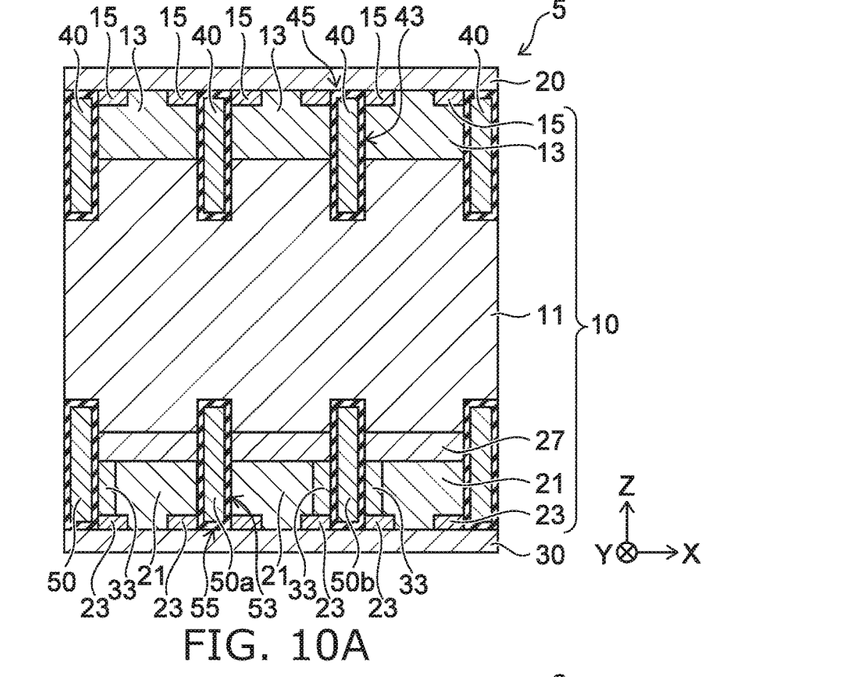
FIGS. 10A and 10B are schematic cross-sectional views showing semiconductor devices according to modifications of the second embodiment.
Figure 10B:
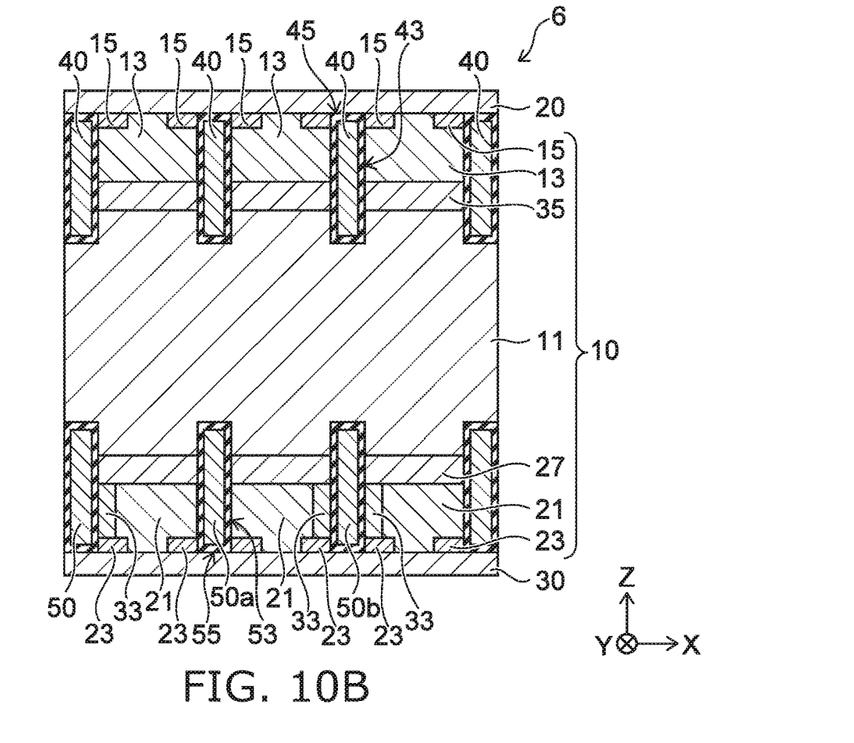

FIGS. 10A and 10B are schematic cross-sectional views showing semiconductor devices 5 and 6 according to modifications of the second embodiment.

In the semiconductor part 10 of the semiconductor device 5 shown in FIG. 10A, the fourth semiconductor layer 21 faces the second control electrode 50a via the third insulating film 53. The ninth semiconductor layer 33 faces the second control electrode 50b via another third insulating film 53.

The fourth semiconductor layer 21 and the ninth semiconductor layer 33 are provided between the adjacent second control electrodes 50a and 50b. The ninth semiconductor layer 33 is positioned between the fourth semiconductor layer 21 and the second control electrode 50b.

In the example as well, the densities of the electrons and holes in the first semiconductor layer 11 in the period $t_1$ to $t_2$ directly before the transition from the diode mode to the IGBT mode can be reduced by performing the carrier control by the control voltages $V_{GE}$ and $V_{BGC}$ shown in FIG. 8B; and the recovery loss in the recovery period from the diode mode can be reduced.

In the semiconductor device 6 shown in FIG. 10B, the semiconductor part 10 further includes a tenth semiconductor layer 35 of the first conductivity type provided between the first semiconductor layer 11 and the second semiconductor layer 13. The tenth semiconductor layer 35 includes a first-conductivity-type impurity with a higher concentration than the first impurity of the first semiconductor layer 11. Also, the tenth semiconductor layer 35 includes the first-conductivity-type impurity with a lower concentration than the first-conductivity-type impurity of the third semiconductor layer 15. The tenth semiconductor layer 35 is, for example, an n-type barrier layer.

By providing the tenth semiconductor layer 35 in the example, the potential barrier to the holes moving from the first semiconductor layer 11 toward the second semiconductor layer 13 can be increased. Thereby, the movement of the holes from the first semiconductor layer 11 toward the second semiconductor layer 13 can be suppressed, and the densities of the electrons and holes in the first semiconductor layer 11 can be increased. In other words, the tenth semiconductor layer 35 is effective for reducing the on-resistance by increasing the densities of the electrons and holes in the first semiconductor layer 11 in both the diode mode and the IGBT mode. The tenth semiconductor layer 35 is not limited to the example; for example, the tenth semiconductor layer 35 also is applicable to the semiconductor devices 1 to 5.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode facing the first electrode;
a semiconductor part provided between the first electrode and the second electrode;
a first control electrode disposed between the first electrode and the semiconductor part inside a first trench provided in the semiconductor part, the first control electrode being electrically insulated from the semiconductor part by a first insulating film and electrically insulated from the first electrode by a second insulating film; and
a plurality of second control electrodes provided between the second electrode and the semiconductor part, the plurality of second control electrodes each being disposed in a second trench provided in the semiconductor part and electrically insulated from the semiconductor part by a third insulating film, the second electrode being provided on the plurality of second control electrodes via a fourth insulating film, the fourth insulating film electrically insulating the plurality of second control electrode from the second electrode,
the plurality of second control electrodes including a first second control electrode, a second control electrode and a third second control electrode, the second control electrode being provided next to the first second control electrode, the third second control electrode being provided next to the second control electrode,
the semiconductor part including a first semiconductor layer of a first conductivity type, a second semiconductor layer of a second conductivity type, a third semiconductor layer of the first conductivity type, a fourth semiconductor layer of the second conductivity type, a fifth semiconductor layer of the first conductivity type, a sixth semiconductor layer of the first conductivity type, and an eighth semiconductor layer of the first conductivity type,
the first semiconductor layer extending between the first electrode and the second electrode, the first trench and the second trench extending in the first semiconductor layer,
the second semiconductor layer being provided between the first semiconductor layer and the first electrode, the second semiconductor layer facing the first control electrode via the first insulating film and being electrically connected to the first electrode,
the third semiconductor layer being selectively provided between the second semiconductor layer and the first electrode, the third semiconductor layer contacting the first insulating film and being electrically connected to the first electrode,
the fourth semiconductor layer being provided between the first semiconductor layer and the second electrode, the fourth semiconductor layer being electrically connected to the second electrode, the fourth semiconductor layer being provided between the first second control electrode and the second control electrode,
the fifth semiconductor layer being selectively provided between the fourth semiconductor layer and the second electrode, the fifth semiconductor layer contacting the third insulating film and being electrically connected to the second electrode,
the sixth semiconductor layer being selectively provided between the first semiconductor layer and the second electrode, the second electrode being connected to the first semiconductor layer via a first-conductivity-type region including the sixth semiconductor layer, the first-conductivity-type region being provided between the second control electrode and the third second control electrode,
the eighth semiconductor layer being provided between the sixth semiconductor layer and the second electrode and including a first-conductivity-type impurity with a higher concentration than a concentration of a first-conductivity-type impurity in the sixth semiconductor layer,
the fourth semiconductor layer facing the second control electrode via the third insulating film,
the sixth semiconductor layer faces the second control electrode via the third insulating film, and
the eighth semiconductor layer contacts the third insulating film and is electrically connected to the second electrode.

2. The device according to claim 1, wherein
the semiconductor part further includes a seventh semiconductor layer of the first conductivity type, the seventh semiconductor layer being provided between the first semiconductor layer and the fourth semiconductor layer, and
the seventh semiconductor layer includes a first-conductivity-type impurity with a higher concentration than a concentration of a first-conductivity-type impurity in the first semiconductor layer.

3. The device according to claim 2, wherein
the semiconductor part further includes another seventh semiconductor layer provided between the first semiconductor layer and the sixth semiconductor layer, and
the first-conductivity-type region includes the sixth semiconductor layer and said another seventh semiconductor layer.

4. The device according to claim 2, wherein
the sixth semiconductor layer is electrically connected to the second electrode, the sixth semiconductor layer including a first-conductivity-type impurity with a higher concentration than a concentration of the first-conductivity-type impurity in the seventh semiconductor layer.

5. The device according to claim 2, wherein
the fifth semiconductor layer includes a first-conductivity-type impurity with a higher concentration than a concentration of the first-conductivity-type impurity in the seventh semiconductor layer.

6. The device according to claim 1, wherein
the first second control electrode and the second control electrode are provided with a first spacing therebetween, and
the second control electrode and the third second control electrode are provided with a second spacing therebetween, the second spacing being different from the first spacing.

7. The device according to claim 1, wherein
the semiconductor part further includes another fourth semiconductor layer provided between the second control electrode and the third second control electrode, and
the sixth semiconductor layer is provided between said another fourth semiconductor layer and the third second control electrode.

8. The device according to claim 7, wherein
an entirety of the sixth semiconductor layer is inverted to the second conductivity type by a voltage applied to the third second control electrode.

9. The device according to claim 1, wherein
the fourth semiconductor layer includes a second-conductivity-type impurity with substantially a same concentration as a concentration of a second-conductivity-type impurity in the second semiconductor layer.

* * * * *

UNITED STATES PATENT AND TRADEMARK OFFICE
CERTIFICATE OF CORRECTION

PATENT NO. : 11,462,633 B2
APPLICATION NO. : 17/015782
DATED : October 4, 2022
INVENTOR(S) : Ryohei Gejo et al.

It is certified that error appears in the above-identified patent and that said Letters Patent is hereby corrected as shown below:

In the Claims

Claim 1, Column 11, Lines 28-29, "a first second control electrode, a second control electrode" should read --a first second control electrode, a second second control electrode--.

Claim 1, Column 11, Lines 30-31, "a third second control electrode, the second control electrode" should read --a third second control electrode, the second second control electrode--.

Claim 1, Column 11, Line 33, "provided next to the second control electrode" should read --provided next to the second second control electrode--.

Claim 1, Column 11, Line 62, "the second control electrode" should read --the second second control electrode--.

Claim 1, Column 12, Lines 7-8, "the second control electrode and the third second control electrode," should read --the second second control electrode and the third second control electrode,--.

Claim 1, Column 12, Lines 16-17, "the fourth semiconductor layer facing the second control electrode" should read --the fourth semiconductor layer facing the second second control electrode--.

Claim 1, Column 12, Lines 17-18, "the sixth semiconductor layer faces the second control electrode" should read --the sixth semiconductor layer faces the second second control electrode--.

Claim 6, Column 12, Lines 56-57, "the second control electrode and the third second control electrode" should read --the second second control electrode and the third second control electrode--.

Claim 7, Column 12, Lines 62-63, "the second control electrode" should read --the second second control electrode--.

Signed and Sealed this
Eleventh Day of July, 2023

Katherine Kelly Vidal
*Director of the United States Patent and Trademark Office*